(12) United States Patent
Han

(10) Patent No.: US 7,518,914 B2
(45) Date of Patent: Apr. 14, 2009

(54) NON-VOLATILE MEMORY DEVICE WITH BOTH SINGLE AND MULTIPLE LEVEL CELLS

(75) Inventor: Jin-Man Han, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 270 days.

(21) Appl. No.: 11/500,153

(22) Filed: Aug. 7, 2006

(65) Prior Publication Data

US 2008/0031041 A1    Feb. 7, 2008

(51) Int. Cl.
*G11C 11/34* (2006.01)
(52) U.S. Cl. .................... 365/185.05; 365/185.03; 365/63
(58) Field of Classification Search ............ 365/185.05, 365/185.03, 63
See application file for complete search history.

(56) References Cited

U.S. PATENT DOCUMENTS

| 6,487,116 | B2 | 11/2002 | Khan et al. | |
|---|---|---|---|---|
| 6,847,550 | B2 | 1/2005 | Park | |
| 6,943,404 | B2 | 9/2005 | Huang et al. | |
| 6,983,428 | B2 * | 1/2006 | Cernea | 716/1 |
| 6,987,694 | B2 * | 1/2006 | Lee | 365/185.17 |

* cited by examiner

*Primary Examiner*—Son Dinh
(74) *Attorney, Agent, or Firm*—Leffert Jay & Polglaze, P.A.

(57) ABSTRACT

A non-volatile memory array with both single level cells and multilevel cells. The single level and multilevel cells, in one embodiment, are alternated either along each bit line. An alternate embodiment alternates the single and multilevel cells along both the bit lines and the word lines so that no single level cell is adjacent to another single level cell in either the word line or the bit line directions.

21 Claims, 7 Drawing Sheets

NON-VOLATILE MEMORY DEVICE WITH BOTH SINGLE AND MULTIPLE LEVEL CELLS

TECHNICAL FIELD OF THE INVENTION

The present invention relates generally to memory devices and in particular the present invention relates to non-volatile memory device architecture.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

As the performance and complexity of electronic systems increase, the requirement for additional memory in a system also increases. However, in order to continue to reduce the costs of the system, the parts count must be kept to a minimum. This can be accomplished by increasing the memory density of an integrated circuit by using such technologies as multilevel cells (MLC). For example, MLC NAND flash memory is a very cost effective non-volatile memory.

Multilevel cells take advantage of the analog nature of a traditional flash cell by assigning a bit pattern to a specific threshold voltage ($V_t$) range stored on the cell. This technology permits the storage of two or more bits per cell, depending on the quantity of voltage ranges assigned to the cell and the stability of the assigned voltage ranges during the lifetime operation of the memory cell.

For example, a cell may be assigned four different voltage ranges of 200 mV for each range. Typically, a dead space or margin of 0.2V to 0.4V is between each range to keep the $V_t$ distributions from overlapping. If the voltage stored on the cell is within the first range, the cell is storing a logical 11 state and is typically considered the erased state of the cell. If the voltage is within the second range, the cell is storing a logical 01 state. This continues for as many ranges that are used for the cell provided these voltage ranges remain stable during the lifetime operation of the memory cell.

One problem with MLC devices, however, is the floating gate-to-floating gate coupling that occurs along the same bit line. This coupling can cause the already small margins between states to disappear and the V, distributions to overlap, thus causing errors in reading data.

For the reasons stated above, and for other reasons stated below which will become apparent to those skilled in the art upon reading and understanding the present specification, there is a need in the art for a memory device that reduces the cell degradation during a program verify operation.

DETAILED DESCRIPTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

Figure 1:
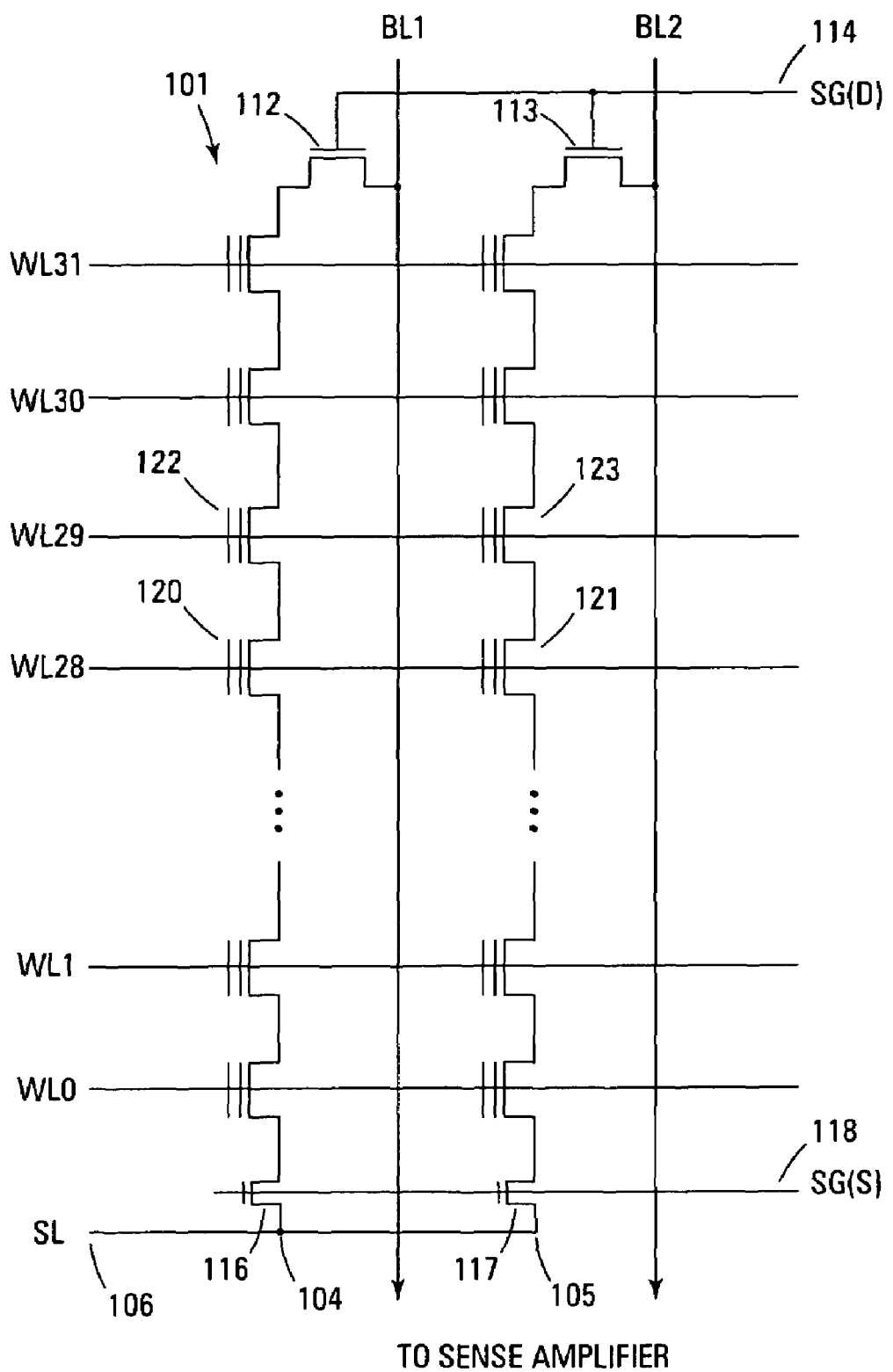
FIG. 1 shows a schematic diagram of one embodiment of a NAND flash memory array.

FIG. 1 illustrates a simplified diagram of one embodiment for a NAND flash memory array of the present invention. The memory array of FIG. 1, for purposes of clarity, does not show all of the elements typically required in a memory array. For example, only two bit lines are shown (BL1 and BL2) when the number of bit lines required actually depends upon the memory density. Additionally, each memory column extends vertically, substantially repeating the series strings of memory cells between two select gates.

The array is comprised of an array of floating gate cells 101 arranged in series strings 104, 105. Each of the floating gate cells 101 are coupled drain to source in each series string 104, 105. A word line (WL0-WL31) that spans across multiple series strings 104, 105 is coupled to the control gates of every floating gate cell in a row in order to control their operation. The embodiment of FIG. 1 shows 32 word lines per memory block. Alternate embodiments could have different quantities of word lines such as 8, 16, or more.

In operation, the word lines (WL0-WL31) select the individual floating gate memory cells in the series string 104, 105 to be written to or read from and operate the remaining floating gate memory cells in each series string 104, 105 in a pass through mode. Each series string 104, 105 of floating gate memory cells is coupled to a source line 106 by a source select gate 116, 117 and to an individual bit line (BL1 and BL2) by a drain select gate 112, 113. The bit lines (BL1 and BL2) are eventually coupled to sense amplifiers (not shown) that detect the state of each cell.

The source select gates 116, 117 are controlled by a source select gate control line SG(S) 118 coupled to their control gates. The drain select gates 112, 113 are controlled by a drain select gate control line SG(D) 114.

Each cell can be programmed as a single level cell (SLC) or multiple bits per cell (i.e., multilevel cell—MLC). Each cell's threshold voltage ($V_t$) determines the data that is stored in the cell. For example, in an SLC, a $V_t$ of 0.5V might indicate a programmed cell while a $V_t$ of −0.5V might indicate an erased cell.

During a typical programming operation, the selected word line for the flash memory cell to be programmed is biased with a series of programming pulses that might start at approximately 16V and increase incrementally if a program verify operation determines the cell is not programmed. The unselected word lines for the unselected cells are typically biased at approximately 10V during the program operation.

The program verification operation with a word line voltage (e.g., 0.5V) is performed to determine if the cell threshold voltage has been increased to the corresponding $V_t$ level in the program operation. A typical prior art method for program verify would bias the unselected word lines with a $V_{pass}$ voltage of approximately 5.8V.

Figure 2:
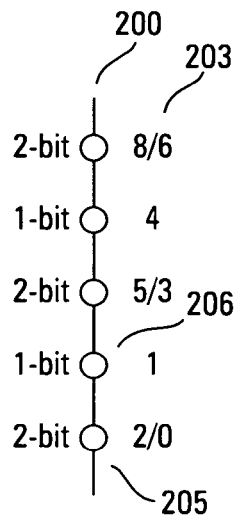
FIG. 2 shows a schematic diagram of a series string of single and multiple level cells and one embodiment of a programming method of the present invention.

FIG. 2 illustrates a schematic diagram of part of a series string 200 of single and multilevel memory cells (SMLC) of the present invention. For purposes of clarity, only five memory cells are shown. However, one skilled in the art will know that the alternating pattern of single and multilevel cells can be repeated throughout a memory array.

The embodiment of FIG. 2 shows that the SLC and MLC are alternated down the series string of memory cells 200. The word lines programmed with SLC memory provide a shield from the 2-bit word lines in order to prevent word line-to-word line coupling. The upper page data does not experience word line-to-word line floating gate coupling.

Figure 5:
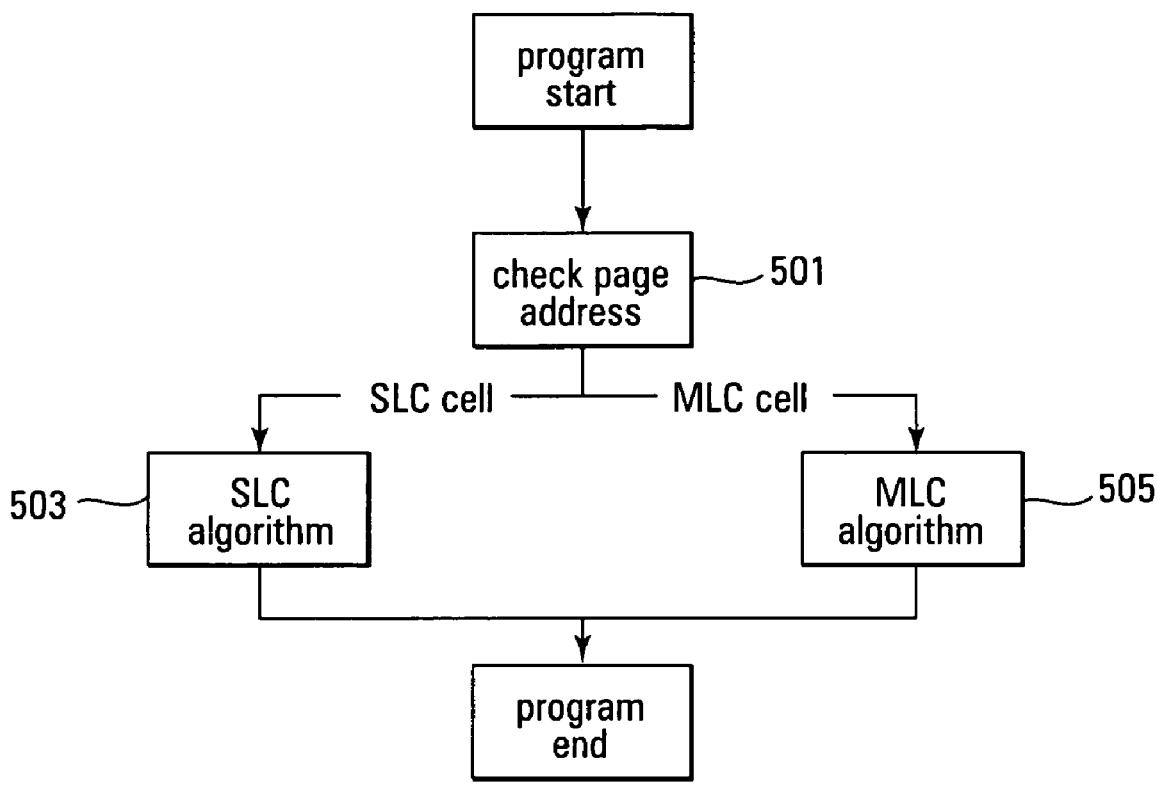
FIG. 5 shows a flowchart of one embodiment of a single and multilevel cell programming method of the present invention.

The SMLC pattern is alternated on every other bit line. The intervening bit lines are not programmed in order to prevent bit line-to-bit line coupling. One embodiment of the method of the present invention for SMLC programming is illustrated in the flowchart of FIG. 5 and threshold voltage distributions of FIGS. 6 and 7 that are described subsequently.

The memory cells are programmed as illustrated on the right side 203 of the memory cells of FIG. 2. The initial programming operation (i.e., operation 0) is performed on the lower page of the cell 205 closest to the source line of the memory block. The next programming operation is performed on the SLC memory cell 206 on the next word line up. The third programming operation returns to the lowest memory cell 205 to program the upper page of that cell. This pattern repeats upward along the bit line. In one embodiment, each bit line of the memory block is programmed using this pattern.

Figure 3:
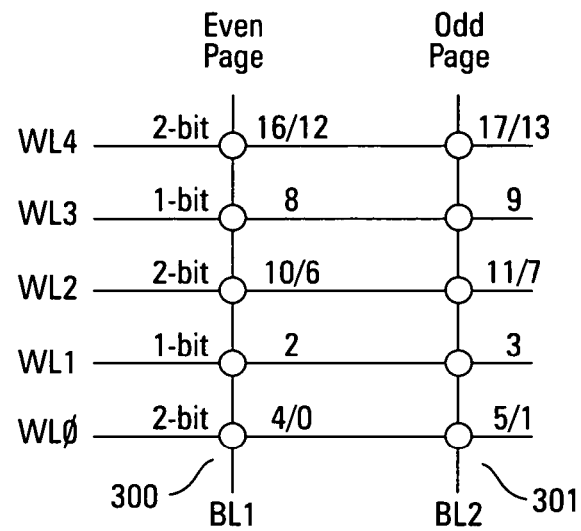
FIG. 3 shows a schematic diagram of a series string of single and multiple level cells and an alternate embodiment of a programming method of the present invention.

FIG. 3 illustrates a schematic diagram of two series strings of SMLC memory of the present invention. As in other embodiments, the SLC and MLC memory alternate along each bit line. This pattern is repeated for each bit line throughout the memory block. In this embodiment, bit lines are set up as even pages 300 and odd pages 301 of data. The even/odd pattern repeats for each pair of memory block bit lines. Alternate embodiments may reverse the even 300 and odd 301 pages.

The programming pattern is illustrated on the right side of each memory cell. As in the previous embodiment, the lower page is programmed first, starting on the word line that is closest to the source line of the memory block. Program operations 0 and 1 start on the first word line WL0 with MLC data and adjacent bit lines 300, 301. Program operations 2 and 3 are performed on the next word line WL1. Program operations 4 and 5 are performed on the upper pages of the first word line WL0.

For purposes of clarity, only word lines WL0-WL4 and two bit lines 300, 301 are shown. However, the programming pattern is repeated for all bit lines and the alternating SLC/MLC pattern is repeated for all word lines throughout the memory block.

In the even/odd page structure of FIG. 3, the upper page data does not experience word line-to-word line or diagonal floating gate coupling. Diagonal floating gate coupling is also eliminated.

Figure 4:
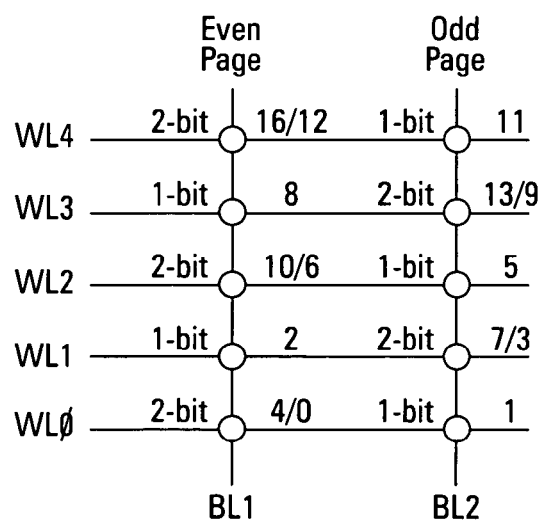
FIG. 4 shows a schematic diagram of a series string of single and multiple level cells and another alternate embodiment of a programming method of the present invention.

FIG. 4 illustrates a schematic diagram of another alternate embodiment of the SMLC memory of the present invention. In this embodiment, not only are the SLC and MLC data alternated along each bit line, but the SLC and MLC data are alternated between even/odd pages along each word line as well. For purposes of clarity, only word lines WL0-WL4 and bit lines BL1-BL2 are illustrated in FIG. 4. However, the same SLC/MLC alternating pattern is repeated along each word line and each bit line of the memory block.

BL1 is subsequently referred to as the even page of data and BL2 is subsequently referred to as the odd page of data. An alternate embodiment may reverse this structure.

The programming order of each memory cell of FIG. 4 is shown on the right side of each memory cell as in previous embodiments. The programming begins with programming operation 0 on the lower page data of BL1 (i.e., even page) of the lowest word line (WL0). Programming operation 1 is then performed on the SLC on WL0 and BL2 (i.e., odd page). The SLC memory cell on WL1 and BL1 is programmed next followed by the lower page of the MLC memory cell of WL1 and BL2. The upper page MLC memory cell of WL0 and BL1 is then programmed followed by the lower page of BL2 and WL2. The lower page data of the MLC memory cell on WL2 and BL1 is then programmed. This programming pattern repeats upward along the bit lines throughout the memory block.

In the embodiment of FIG. 4, the upper page of data does not experience either word line-to-word line or bit line-to-bit line coupling. There is a possibility of diagonal coupling between word lines but this coupling is substantially reduced from other types of coupling. In one embodiment, the diagonal coupling is only ten percent of the word line-to-word line and bit line-to-bit line coupling.

FIG. 5 shows a flowchart of one embodiment of the SMLC programming method of the present invention. The method starts by checking a user supplied page address 501 to determine whether SLC or MLC programming is needed. For example, referring to FIG. 4, SLC programming is selected 503 if the page address is one of 1/2/5/8/11. MLC programming is selected 505 if the page address is one of 0/3/4/6/7/9/10/12. The other embodiments illustrated FIGS. 2 and 3, as well as alternate embodiments not illustrated here, would obviously select the SLC and MLC programming with different page addresses.

Figure 6:
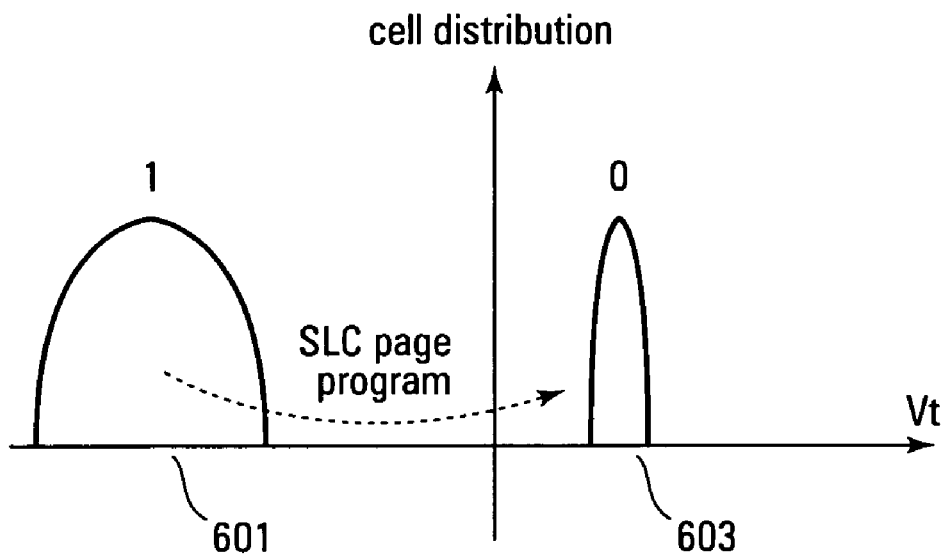
FIG. 6 shows a threshold voltage distribution for a single level cell and the result of a single level cell page programming.

FIG. 6 illustrates the threshold voltage ($V_t$) distribution movement resulting from a selected SLC programming. In SLC programming, a cell is either in a logical "1" state 601 or a logical "0" state 603. The logical "1" state 601 is considered the erased state. Therefore, the SLC page programming would result in a $V_t$ distribution of the 0 state 603.

Figure 7:
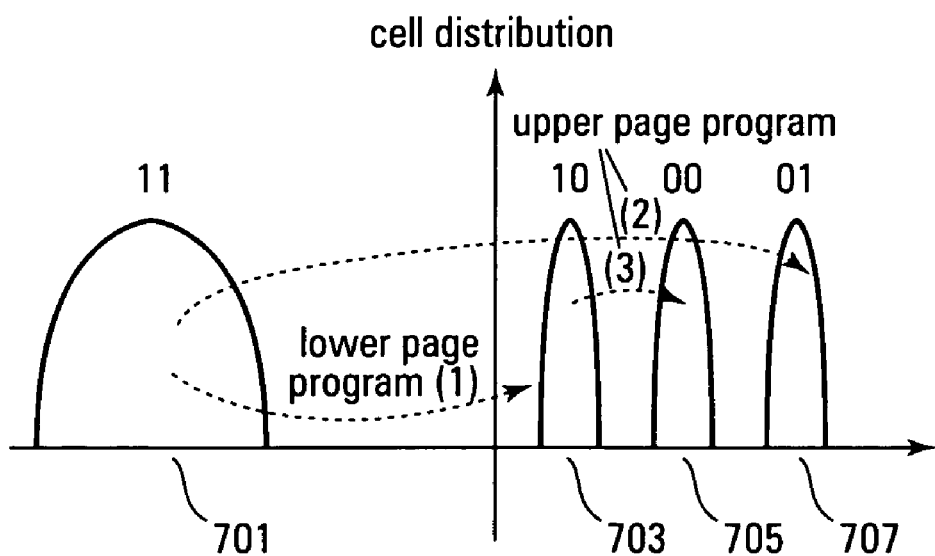
FIG. 7 shows a threshold voltage distribution for a multilevel cell and the result of upper and lower page programming.

FIG. 7 illustrates the threshold voltage distribution movements resulting from a selected MLC programming. The MLC algorithm has three possible cell $V_t$ movements based on program data supplied by the user. The lower page programming, similar to SLC programming, is from the logical "11" erase state 701 to the logical "10" state 703.

The upper page programming has two possible $V_t$ movements. One is from the programmed "10" state 703 to the "00" state 705. The other is from the erased state 701 to the programmed "01" state 707. In the embodiment of FIG. 7, state "10" means the upper page is a logic 1 and the lower page is a logic 0.

The threshold voltage distributions of FIG. 7 illustrate only one embodiment for cell state assignments. Alternate embodiments can assign cell states to different threshold voltage distributions. The embodiments of the SMLC programming method of the present invention can work with any possible cell state assignment.

Figure 8:
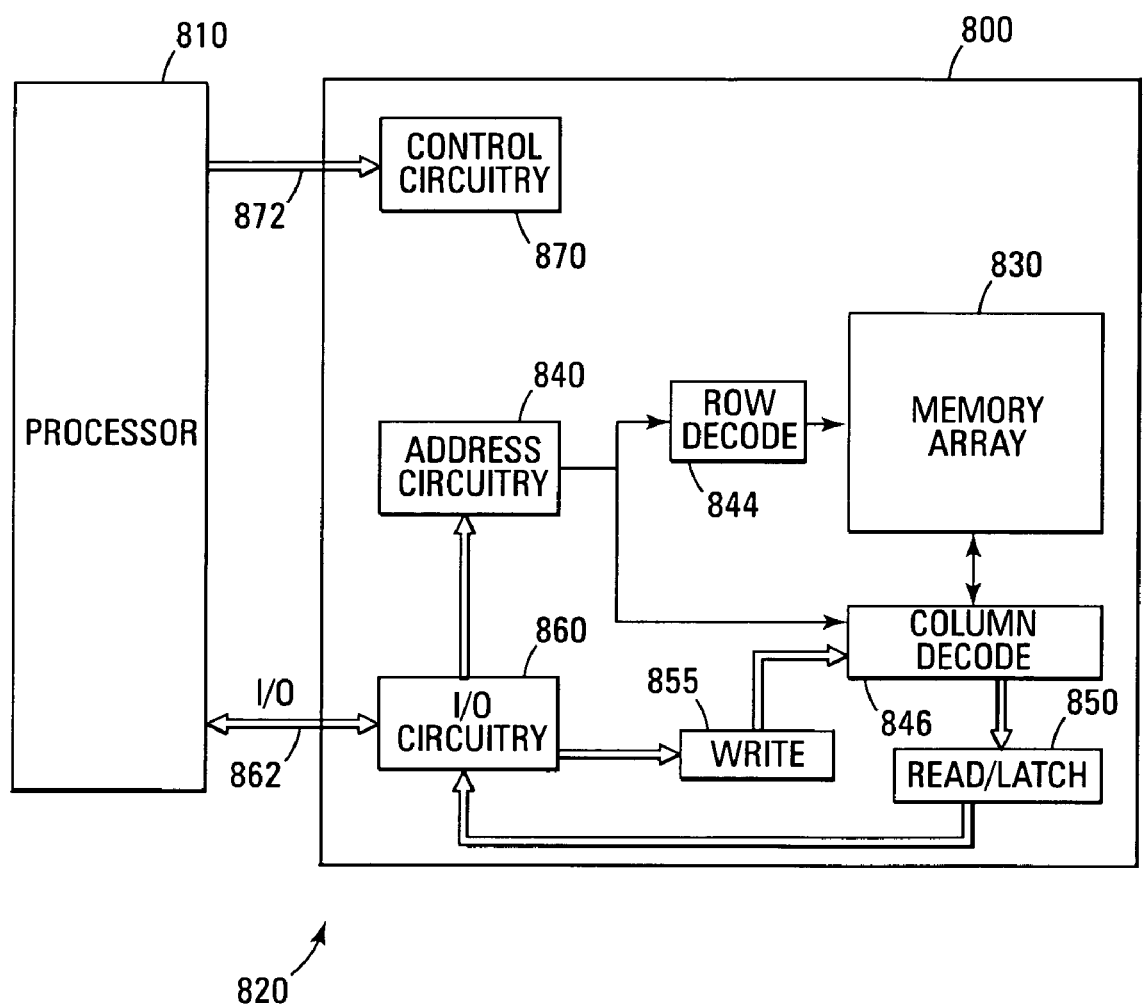
FIG. 8 shows a block diagram of an electronic memory system of the present invention.

FIG. 8 illustrates a functional block diagram of a memory system 820 comprising a memory device 800 coupled to a processor 810. The processor 810 may be a microprocessor or some other type of controlling circuitry. They memory system 820 can be made up of separate integrated circuits or both the processor 810 and memory device 800 on the same integrated circuit. The memory device 800 has been simplified to focus on features of the memory that are helpful in understanding the present invention.

The memory device includes an array of non-volatile memory cells 830 that can be floating gate flash memory cells. The memory array 830 is arranged in banks of rows and columns. The control gates of each row of memory cells are coupled with a word line while the drain regions of the memory cells are coupled to bit lines. The source regions of the memory cells are coupled to source lines. As is well known in the art, the connection of the cells to the bit lines and source lines depends on whether the array is a NAND architecture, a NOR architecture, an AND architecture or some other memory array architecture.

An address buffer circuit 840 is provided to latch address signals provided over I/O connections 862 through the I/O circuitry 860. Address signals are received and decoded by a row decoder 844 and a column decoder 846 to access the memory array 830. It will be appreciated by those skilled in the art that, with the benefit of the present description, the number of address input connections depends on the density and architecture of the memory array 830. That is, the number of addresses increases with both increased memory cell counts and increased bank and block counts.

The memory integrated circuit 800 reads data in the memory array 830 by sensing voltage or current changes in the memory array columns using sense/buffer circuitry 850. The sense/buffer circuitry, in one embodiment, is coupled to read and latch a row of data from the memory array 830. Data input and output buffer circuitry 860 is included for bi-directional data communication over the I/O connections 862 with the processor 810. Write circuitry 855 is provided to write data to the memory array.

Control circuitry 870 decodes signals provided on control connections 872 from the processor 810. These signals include chip enable signals, write enable signals, and address latch signals that are used to control the operations on the memory array 830, including data read, data write, and erase operations. In one embodiment, the control circuitry 870 is responsible for executing the programming methods of the present invention as well as determining whether a particular memory cell is programmed as an SLC or an MLC memory. The control circuitry 870 may be a state machine, a sequencer, or some other type of controller.

The non-volatile memory device illustrated in FIG. 8 has been simplified to facilitate a basic understanding of the features of the memory. A more detailed understanding of internal circuitry and functions of flash memories are known to those skilled in the art.

In one embodiment, the programming methods of the present invention are controlled and executed by internal on-chip circuitry. In an alternate embodiment, the programming of SLC and MLC can be implemented on a system level. For example, the memory control circuit or the processor can selectively apply page addresses so that SLC and MLC programming is alternated. If the controller/processor decoding is software-based, the controller can support different kinds of page selection based on the applications.

Figure 10:
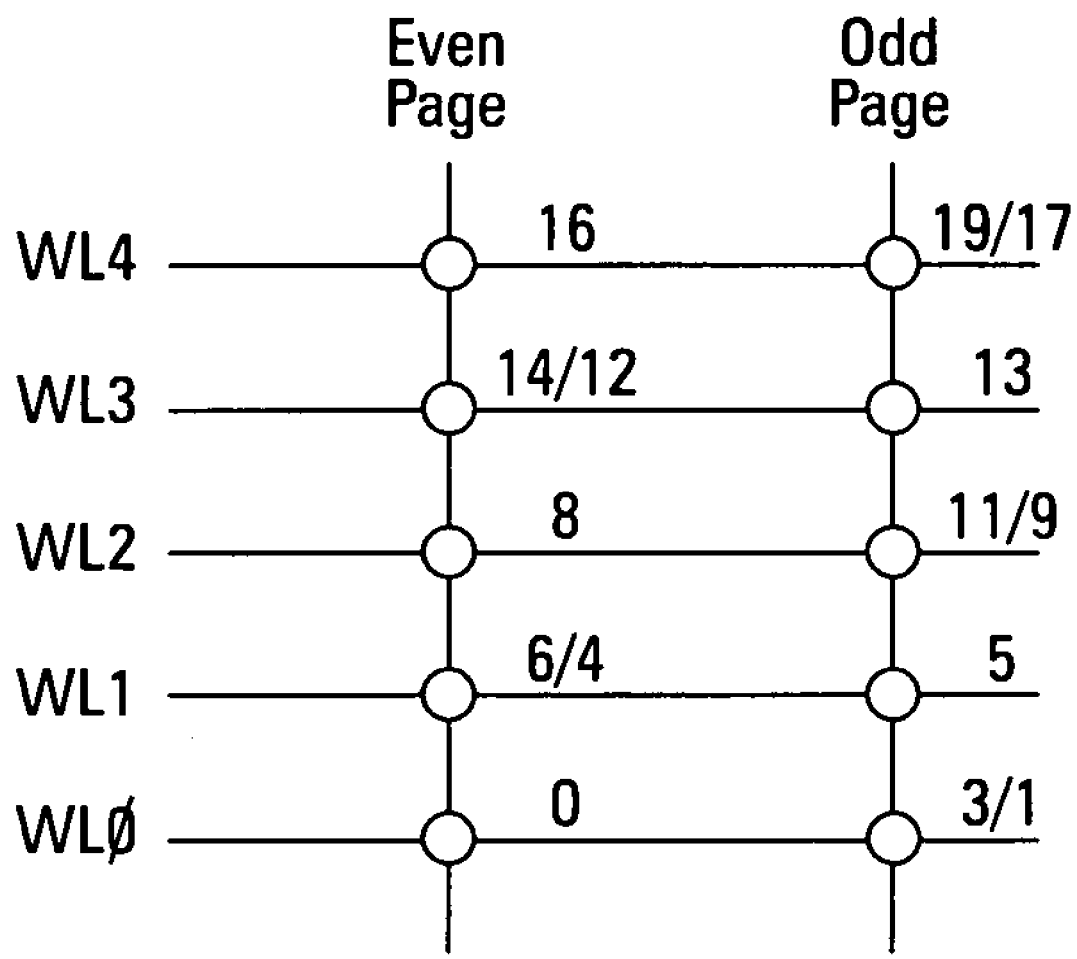
FIG. 10 shows a schematic diagram of a series string of single and multiple level cells and an alternate embodiment of a programming method of the present invention.

FIG. 10 illustrates one embodiment of such a software-based programming method of the present invention. In this embodiment, the controller skips page addresses 2, 7, 10, 15, and 18 to program SLC and MLC alternatively. This pattern repeats for the remainder of the programming operation and is transparent to the end user.

Figure 9:
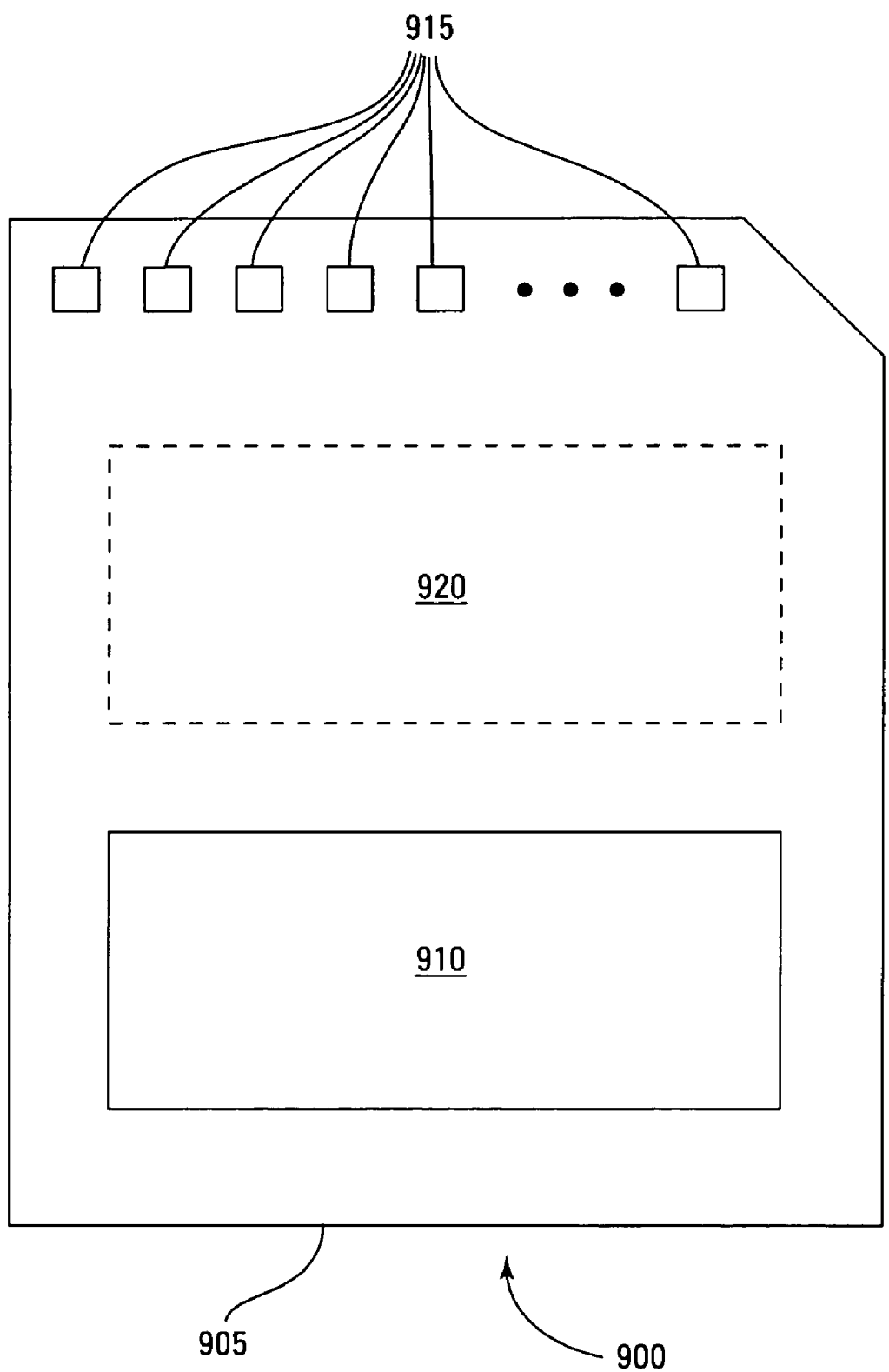
FIG. 9 shows a block diagram of one embodiment of a memory module of the present invention.

FIG. 9 is an illustration of an exemplary memory module 900. Memory module 900 is illustrated as a memory card, although the concepts discussed with reference to memory module 900 are applicable to other types of removable or portable memory, e.g., USB flash drives, and are intended to be within the scope of "memory module" as used herein. In addition, although one example form factor is depicted in FIG. 9, these concepts are applicable to other form factors as well.

In some embodiments, the memory module 900 includes a housing 905 (as depicted) to enclose one or more memory devices 910, though such a housing is not essential to all devices or device applications. At least one memory device 910 is a non-volatile memory [including or adapted to perform elements of the invention]. Where present, the housing 905 includes one or more contacts 915 for communication with a host device. Examples of host devices include digital cameras, digital recording and playback devices, PDAs, personal computers, memory card readers, interface hubs and the like. For some embodiments, the contacts 915 are in the form of a standardized interface. For example, with a USB flash drive, the contacts 915 might be in the form of a USB Type-A male connector. For some embodiments, the contacts 915 are in the form of a semi-proprietary interface, such as might be found on COMPACTFLASH memory cards licensed by SANDISK Corporation, MEMORYSTICK memory cards licensed by SONY Corporation, SD SECURE DIGITAL memory cards licensed by TOSHIBA Corporation and the like. In general, however, contacts 915 provide an interface for passing control, address and/or data signals between the memory module 900 and a host having compatible receptors for the contacts 915.

The memory module 900 may optionally include additional circuitry 920 that may be one or more integrated circuits and/or discrete components. For some embodiments, the additional circuitry 920 may include a memory controller for controlling access across multiple memory devices 910 and/or for providing a translation layer between an external host and a memory device 910. For example, there may not be a one-to-one correspondence between the number of contacts 915 and a number of I/O connections to the one or more memory devices 910. Thus, a memory controller could selectively couple an I/O connection (not shown in FIG. 9) of a memory device 910 to receive the appropriate signal at the appropriate I/O connection at the appropriate time or to provide the appropriate signal at the appropriate contact 915 at the appropriate time. Similarly, the communication protocol between a host and the memory module 900 may be different than what is required for access of a memory device 910. A memory controller could then translate the command sequences received from a host into the appropriate command sequences to achieve the desired access to the memory device 910. Such translation may further include changes in signal voltage levels in addition to command sequences.

The additional circuitry 920 may further include functionality unrelated to control of a memory device 910 such as a logic functions as might be performed by an ASIC (application specific integrated circuit). Also, the additional circuitry 920 may include circuitry to restrict read or write access to the memory module 900, such as password protection, biometrics or the like. The additional circuitry 920 may include circuitry to indicate a status of the memory module 900. For example, the additional circuitry 920 may include functionality to determine whether power is being supplied to the memory module 900 and whether the memory module 900 is currently being accessed, and to display an indication of its status, such as a solid light while powered and a flashing light while being accessed. The additional circuitry 920 may further include passive devices, such as decoupling capacitors to help regulate power requirements within the memory module 900.

CONCLUSION

In summary, the embodiments of the present invention include a NAND flash memory integrated circuit and methods for programming. By alternating 2-bit programming for every other word line in a serial string, memory density is improved by 50% over typical SLC devices. At the same time, the 1-bit word lines act as shields to eliminate word line-to-word line floating gate coupling in the serial string. Alternate embodiments that also alternate 1-bit and 2-bit programming between bit lines would also eliminate most bit line-to-bit line coupling.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A non-volatile memory device comprising:
  a memory array comprising a plurality of memory cells arranged in rows and columns such that the rows are each coupled to a word line and the columns are serial strings of memory cells that are each coupled to a bit line, the memory cells of each serial string alternating between single level cells and multilevel cells.

2. The device of claim 1 wherein the multilevel cells store at least two data bits and the single level cells store one data bit.

3. The device of claim 1 wherein the non-volatile memory device is a flash memory device.

4. The device of claim 1 and further including a sense amplifier coupled to the bit lines for sensing data on selected memory cells.

5. The device of claim 1 wherein each series string of memory cells further comprises a drain select gate transistor coupling the string to the bit line.

6. The device of claim 1 wherein the series string of memory cells further comprises a source select gate transistor coupling the string to a source line.

7. The device of claim 1 wherein each serial string is comprised of thirty-two flash memory cells.

8. A NAND flash memory device comprising:
  memory control circuitry that controls memory operations; and
  a memory array coupled to the memory control circuitry, the memory array comprising a plurality of memory cells arranged in rows and columns such that the rows are each coupled to a word line and the columns are serial strings of memory cells that are each coupled to a bit line, the memory cells of each serial string alternating between single level cells and multilevel cells in response to the memory control circuitry.

9. The device of claim 8 wherein the memory control circuit is a state machine.

10. A non-volatile memory device comprising:
  a memory array comprising a plurality of memory cells arranged in rows and columns such that the rows are each coupled to a word line and the columns are serial strings of memory cells that are each coupled to a bit line, the memory cells of each serial string alternating between single level cells and multilevel cells and the memory cells along each word line alternating between single level cells and multilevel cells.

11. The device of claim 10 and further including a control circuit coupled to the memory array for controlling whether a memory cell is multilevel or single level.

12. The device of claim 10 wherein a single level cell stores one data bit and a multilevel cell stores a plurality of data bits.

13. A memory system comprising:
  a processor for generating memory signals for the system; and
  a memory device coupled to the processor and operating in response to the memory signals, the memory device comprising:
    memory control circuitry that controls memory operations; and
    a memory array coupled to the memory control circuitry, the memory array comprising a plurality of memory cells arranged in rows and columns such that the rows are each coupled to a word line and the columns are serial strings of memory cells that are each coupled to a bit line, the memory cells of each serial string alternating between single level cells and multilevel cells in response to the memory control circuitry.

14. The system of claim 13 wherein the memory signals comprise control, data, and address signals.

15. The system of claim 13 wherein the memory device is a NAND flash memory device.

16. The system of claim 13 wherein the processor generates selective page addresses for the memory device.

17. The system of claim 13 wherein the memory control circuitry generates selective page addresses for the memory device.

18. A memory module comprising:
  at least two memory devices, each comprising:
    memory control circuitry that controls memory operations; and a memory array coupled to the memory control circuitry, the memory array comprising a plurality of memory cells arranged in rows and columns such that the rows are each coupled to a word line and the columns are serial strings of memory cells that are each coupled to a bit line, the memory cells of each serial string alternating between single level cells and multilevel cells in response to the memory control circuitry; and a plurality of contacts configured to provide selective contact between each memory device and a host system.

19. The module of claim 18 and further including a processor coupled to the at least two memory devices for controlling operation of the memory module in response to the host system.

20. A memory module comprising:
    a memory device comprising:
        memory control circuitry that controls memory operations; and
        a memory array coupled to the memory control circuitry, the memory array comprising a plurality of memory cells arranged in rows and columns such that the rows are each coupled to a word line and the columns are serial strings of memory cells that are each coupled to a bit line, the memory cells of each serial string alternating between single level cells and multilevel cells in response to the memory control circuitry;
    a housing for enclosing the memory device; and
    a plurality of contacts coupled to the housing and configured to provide selective contact between the memory device and a host system.

21. The memory module of claim 20 wherein the memory array is comprised of a NAND architecture of flash memory cells.

* * * * *